(12) United States Patent
Mulligan et al.

(10) Patent No.: US 7,339,110 B1
(45) Date of Patent: Mar. 4, 2008

(54) SOLAR CELL AND METHOD OF MANUFACTURE

(75) Inventors: William P. Mulligan, San Jose, CA (US); Michael J. Cudzinovic, Sunnyvale, CA (US); Thomas Pass, San Jose, CA (US); David Smith, San Jose, CA (US); Neil Kaminar, Boulder Creek, CA (US); Keith McIntosh, Newport Beach (AU); Richard M. Swanson, Los Altos, CA (US)

(73) Assignee: SunPower Corporation, San Jose, CA (US)

( * ) Notice: Subject to any disclaimer, the term of this patent is extended or adjusted under 35 U.S.C. 154(b) by 726 days.

(21) Appl. No.: 10/412,638

(22) Filed: Apr. 10, 2003

(51) Int. Cl.
*H01L 31/00* (2006.01)

(52) U.S. Cl. ................................ 136/256; 136/261
(58) Field of Classification Search ........ 136/243–265; 205/170, 182–184
See application file for complete search history.

(56) References Cited

U.S. PATENT DOCUMENTS

| | | | |
|---|---|---|---|
| 4,234,352 A | 11/1980 | Swanson | |
| 4,478,879 A | 10/1984 | Baraona et al. | |
| 4,920,639 A * | 5/1990 | Yee | 29/846 |
| 4,927,770 A | 5/1990 | Swanson | |
| 5,053,083 A | 10/1991 | Sinton | |
| 5,320,684 A * | 6/1994 | Amick et al. | 136/256 |
| 5,538,564 A * | 7/1996 | Kaschmitter | 136/255 |
| 5,641,362 A * | 6/1997 | Meier | 136/256 |
| 6,624,737 B2 * | 9/2003 | Chang et al. | 338/9 |

2004/0200520 A1  10/2004  Mulligan et al.

OTHER PUBLICATIONS

You, J. et al, "A Study on Cu Metallization for Crystalline Si Solar Cells". Conf. REc. 29th IEEE PV Spec. Conf., 277-280, (May 2002).*

Sinton et al., "27.5-Percent Silicon Concentrator Solar Cells," IEEE Electronic Device Letters, vol. EDL-7, No. 10, Oct. 1986, pp. 567-569.

(Continued)

*Primary Examiner*—Nam Nguyen
*Assistant Examiner*—Jeffrey Barton
(74) *Attorney, Agent, or Firm*—Okamoto & Benedicto LLP

(57) ABSTRACT

A solar cell that is readily manufactured using processing techniques which are less expensive than microelectronic circuit processing. In preferred embodiments, printing techniques are utilized in selectively forming masks for use in etching of silicon oxide and diffusing dopants and in forming metal contacts to diffused regions. In a preferred embodiment, p-doped regions and n-doped regions are alternately formed in a surface of the wafer in offset levels through use of masking and etching techniques. Metal contacts are made to the p-regions and n-regions by first forming a seed layer stack that comprises a first layer such as aluminum that contacts silicon and functions as an infrared reflector, second layer such titanium tungsten that acts as diffusion barrier, and a third layer functions as a plating base. A thick conductive layer such as copper is then plated over the seed layer, and the seed layer between plated lines is removed. A front surface of the wafer is preferably textured by etching or mechanical abrasion with an antireflection layer provided over the textured surface. A field layer can be provided in the textured surface with the combined effect being a very low surface recombination velocity.

16 Claims, 6 Drawing Sheets

OTHER PUBLICATIONS

Verlinden et al., "High Efficiency Interdigitated Back Contact Silicon Solar Cells," Proc. 19th IEEE Photovolt. Solar Energy Conf., New Orleans, LA, May 1987, pp. 405-410.

Sinton et al., "Simplified Backside-Contact Solar Cells," IEEE Transactions on Electron Devices, vol. 37, No. 2, Feb. 1990, pp. 348-352.

Gee et al., "Emitter Wrap-Through Solar Cell," 23rd IEEE Photo. Spec. Conf., 1993, pp. 265-270.

Verlinden et al., "High Efficiency Silicon Point-Contact Solar Cells for Concentrator and High Value One-Sun Applications," 12th European Photovoltaic Solar Energy Conference, Amsterdam, The Netherlands, Apr. 11-15, 1994, pp. 1477-1480.

Gee et al., "Progress on the Emitter Wrap-Through Silicon Solar Cell," 12th European Photovoltaic Solar Energy Conference, Amsterdam, The Netherlands, Apr. 11-15, 1994, pp. 743-746.

Schönecker et al., "An Industrial Multi-Crystalline EWT Solar Cell with Screen Printed Metallisation," 14th European Photovoltiac Solar Energy Conference, Barcelona, Spain, Jun. 30-Jul. 4, 1997, pp. 796-799.

Meier et al., "Self-Doping Contacts and Associated Silicon Solar Cell Structures," 2nd World Conference and Exhibition on Photovoltiac Solar Energy Conversion, Vienna, Austria, Jul. 6-10, 1998, pp. 1491-1494.

Faika et al., "Simplification on EWT (Emitter Wrap-Through) Solar Cell Fabrication using AL-P-Codiffusion," Proc. 28th IEEE Photovoltaic Specialists Conf., 2000, pp. 260-263.

Van Kerschaver et al., "Towards Back Contact Silicon Solar Cells with Screen Printed Metallisation," Proc. 28th IEEE Photovoltaic Specialists Conf., 2000, pp. 209-212.

Kress et al., "10×10 cm² Screen Printed Back Contact Cell with a Selective Emitter," Proc. 28th IEEE Photovoltaic Specialists Conf., 2000, pp. 213-216.

* cited by examiner

SOLAR CELL AND METHOD OF MANUFACTURE

BACKGROUND OF THE INVENTION

This invention relates generally to solar cells, and more particularly the invention relates to a solar cell structure which is efficient in operation and economical to manufacture.

The use of photovoltaic cells for the direct conversion of solar radiation into electrical energy is well known, see Swanson, U.S. Pat. No. 4,234,352 for example. Briefly, the photovoltaic cell comprises a substrate of semiconductive material having a p-n junction defined therein. In the conventional silicon cell the p-n junction is formed near a surface of the substrate which receives impinging radiation. Radiated photons create mobile carriers (holes and electrons) and the substrate which can be directed to an electrical circuit outside of the cell. Only photons having at least a minimum energy level (e.g., 1.1 electron volt for silicon) can generate an electron-hole pair in the semiconductor pair. Photons having less energy are either not absorbed or are absorbed as heat, and the excess energy of photons having more than 1.1 electron volt energy (e.g. photons have a wavelength of 1.1 μm and less) create heat. These and other losses limit the efficiency of silicon photovoltaic cells in directly converting solar energy to electricity to less than 30%.

Solar cells with interdigitated contacts of opposite polarity on the back surface of the cell are known and have numerous advantages over conventional solar cells with front side metal grids and blanket or grid metallized backside contacts, including improved photo-generation due to elimination of front grid shading, much reduced grid series resistance, and improved "blue" photo-response since heavy front surface doping is not required to minimize front contact resistance because there are no front contacts. In addition to the performance advantages, the back-contact cell structure allows simplified module assembly due to coplanar contacts. See Swanson U.S. Pat. No. 4,927,770 for example.

While interdigitated back-contact (IBC) solar cells have been fabricated, cost considerations have prevented the IBC solar cell from being commercialized. Heretofore, conventional microelectronics (integrated circuit) processing has been employed in fabricating IBC solar cells, including the use of backside diffusions, contacts, and metal lines fabricated by conventional microelectronics photolithography, thin film metallization, and etching processes. This fabrication process is capable of producing high efficiency solar cells, but the process is not cost effective for application in conventional low-cost, flat-plate solar panels. The key problem with practical realization of an IBC solar cell by this process is the high cost of fabrication, including the use of photoresist materials, processing and mask alignment, and the use of thick metal conductor deposition by vacuum evaporation or sputtering. Further, the processing must be carried out in a clean room environment. Thus IBC solar cells fabricated using these methods have been restricted to application in high concentration solar cells or in very high value one-sun applications.

BRIEF SUMMARY OF THE INVENTION

In accordance with the invention, a solar cell structure is provided which can be readily manufactured using alternative processing techniques which are less expensive than microelectronic circuit processing.

In one preferred embodiment, a silicon cell having a first major surface for receiving solar radiation has an opposing or backside surface in which p-doped and n-doped regions are formed in a spaced parallel arrangement. The p and n regions can be in offset planes or in the same plane. Interdigitated metal contacts respectively contact the p and n doped regions.

More particularly, the doped regions can be formed by first applying one dopant type to the entire back side of the cell by high temperature diffusion. Next, a patterned etch resist is applied to the cell by a low cost printing technology. This is followed by selective etching of a thermal oxide and doped region, and then by high temperature diffusion of the other dopant and thermal growth of a silicon oxide layer.

In forming the interdigitated metal contacts to the p and n regions, arrays of small contact openings are fabricated in the silicon oxide layer by using a patterned etch resist and chemical etching. A seed layer metal stack is then sputtered on the back side of the cell. The first metal in the stack provides ohmic contact to the silicon through the contact openings in the oxide and acts as an infrared reflector. A second metal layer acts as a diffusion barrier and adhesion layer. A top metal layer then forms a base to initiate plating. A sputtered plating resist is then applied over the seed layer, and metal is plated to the cell to build up thickness for the metal grid lines. Finally, the plating resist is stripped, and the metal seed layer between the grid lines is removed by chemical etching.

The first surface of the cell is preferably textured, as is conventional in solar cells. The texturing is preferably accomplished chemically. An antireflection coating is then applied over the textured surface to assist in the coupling of light energy into the solar cell and hence improve efficiency.

The invention and objects and features thereof will be more readily apparent from the following detailed description and appended claims when taken with the drawings.

DETAILED DESCRIPTION OF THE INVENTION

Figure 1:
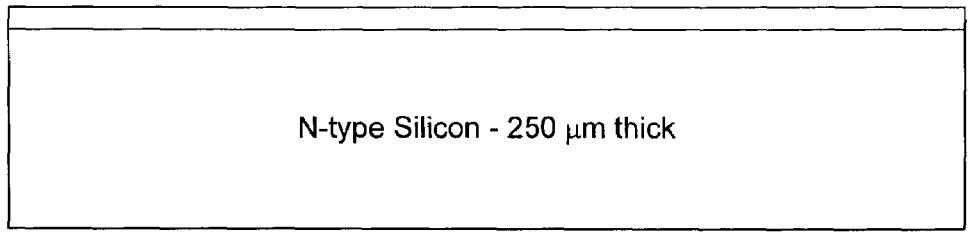
FIGS. 1-15 are side views in section illustrating steps in fabricating a solar cell in accordance with one embodiment of the invention.

A solar cell in accordance with the invention is preferably manufactured in a single crystalline silicon substrate having a (100) crystalline orientation or in a multi-crystalline silicon substrate with minority carrier lifetime greater than 200 microseconds. FIG. 1 is a side view in section of such a wafer 10 which is doped n-type in the resistivity range of 1-20 ohm/cm and with a thickness of approximately 200 μm. The first step of the process is caustic etching of the wafer using KOH or NaOH to remove solid damage from ingot wafering. Typically, 20-50 μm of silicon are removed. After the caustic etch, the wafers are cleaned using a standard pre-diffusion, wet cleaning sequence.

Figure 2:
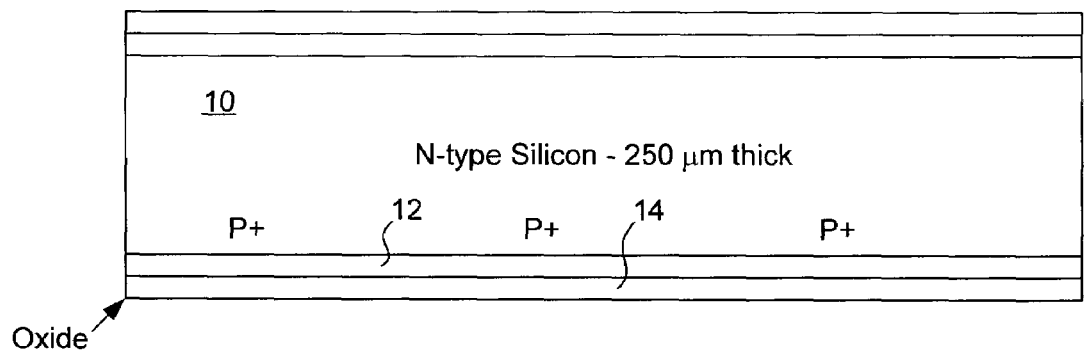

Next, as shown in FIG. 2, the wafer is blanket-diffused on both sides in diffusion boats in a high temperature diffusion furnace. In a preferred embodiment, a liquid boron dopant source ($BBr_3$) is used and a dopant drive forms a p+ layer 12.

The dopant drive is followed by growth of a thermal silicon oxide layer 14. Optimum values for junction depth, sheet resistance, and thermal oxide thickness depend on factors such as substrate resistivity and contact dimensions. In the preferred embodiment, junction depth, sheet resistance, and thermal oxide thickness are approximately 1.8 µm, 16 ohms per square, and 2500 Å, respectively.

Alternatively, the polarity of the diffusions can be reversed, with n+ diffusion as the first step instead of a p+ diffusion. The boron dopant can be diffused on one side of the wafer only by back-to-back loading of wafers into the diffusion boats.

Figure 3:
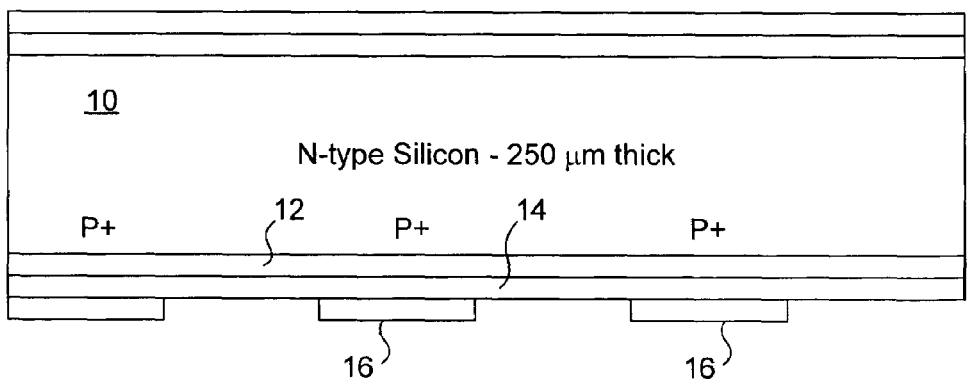

Next as shown in FIG. 3, a patterned etch resist 16 is applied over the back side thermal oxide 14. The etch resist is directly patterned on the structure by screen-printing. Resists are then either thermal or UV-cured.

Figure 4:
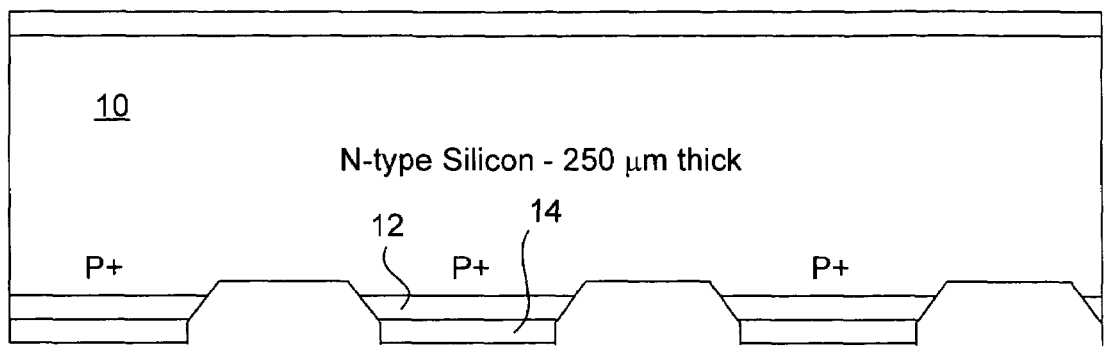

As shown in FIG. 4, openings in the thermal oxide are chemically etched in the areas not covered by the printed etch resist 16. The resist is removed in a caustic solution with the width of the openings being about 0.7 mm and the pitch of the openings being about 2 mm. Another caustic etch (concentrated KOH) is then used to etch about 3 µm of silicon completely through layer 12 and the diffusion junction of FIG. 2, as taught in U.S. Pat. No. 5,053,083, for example. The boron diffusion on the front side of the wafer is also removed during this etch.

Figure 5:
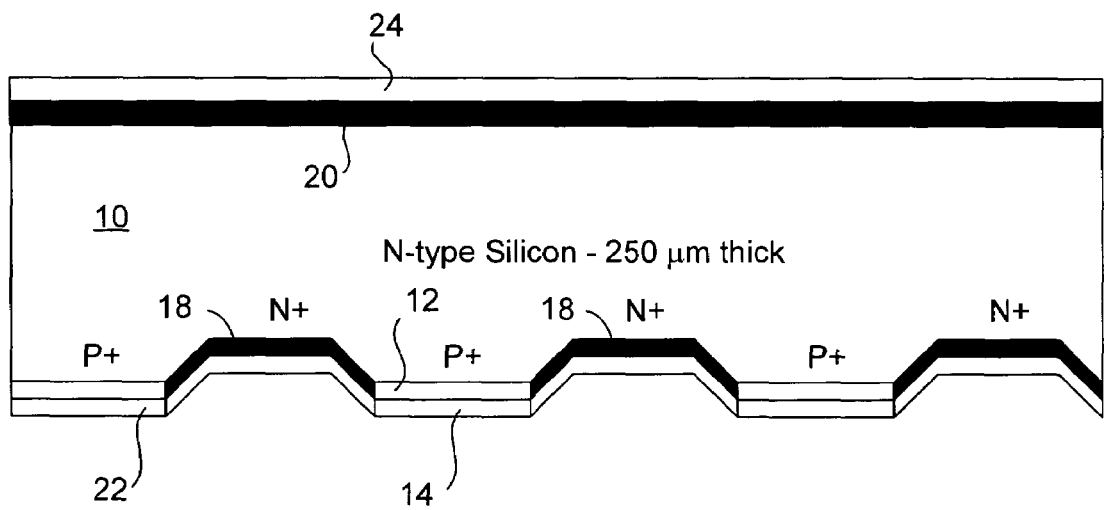

The wafers are then diffused on both sides in a high temperature diffusion furnace to form n+ layer 18 on the back side and n+ layer 20 on the top surface as shown in FIG. 5. In a preferred embodiment, a liquid phosphorous source ($POCl_3$) is used. Alternatively, the polarity of the diffusions can be reversed, consistent with FIG. 2, with p+ diffusion instead of n+ diffusion. The wafers can be diffused on one-side-only by back-to-back loading of the wafers in the diffusion boats. The high temperature diffusion furnace also forms thermally grown oxide layer 22 over n+ region 18 and oxide layer 24 over layer 20. In the preferred embodiment, the junction depth of regions 18, 20 is approximately 0.9 µm, and the resultant sheet resistance is approximately 40 ohms/square. The thickness of the thermal oxide layers 22, 24 is approximately 950 Å.

Other n+ dopants such as As or Sb can be employed.

Figure 6:
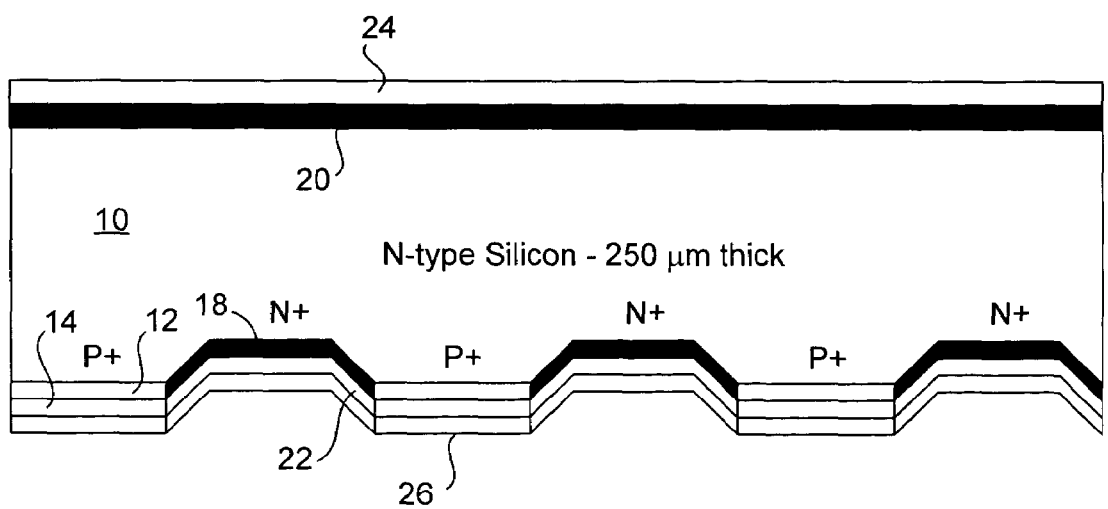

Next as shown in FIG. 6, an unpatterned etch resist 26 is applied over the back side of substrate 10 and is used to protect the back side oxide 14, 22 from subsequent etching. The etch resist is directly applied on the substrate by screen printing. The resist can then be cured either thermally or by UV.

Figure 7:
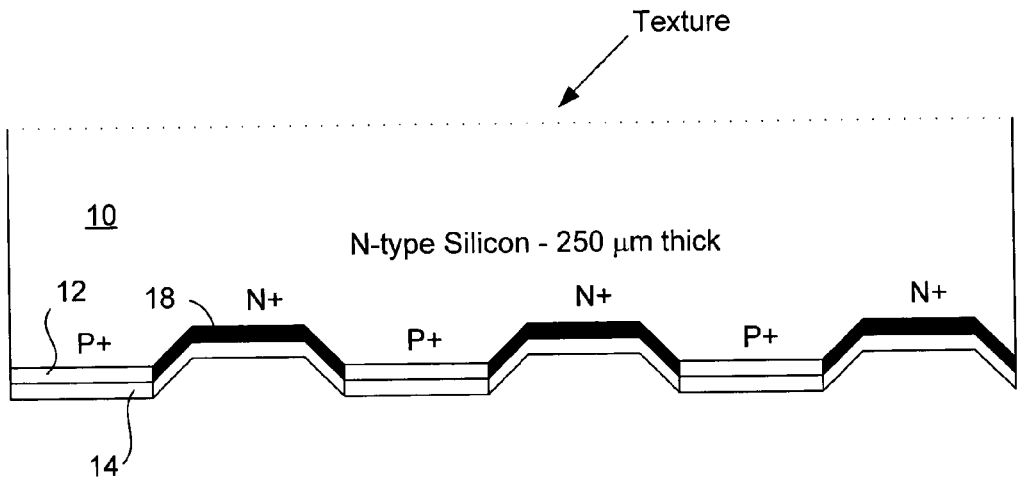

As shown in FIG. 7, a textured surface is next formed in the top surface of substrate 10. In the preferred embodiment (100) oriented single crystal wafers are used and the oxide on the top surface is removed by chemical etching. The back side is protected during this etch by the etch resist 26 applied in FIG. 6. After the front oxide is removed, the back side etch resist is removed in a caustic solution. Another caustic solution (KOH/IPA) is then used to preferentially expose the (111) planes of silicon on the front side of substrate 10, creating a textured surface with square pyramidal features that have a random distribution of apexes and heights, with heights typically ranging from 1-10 µm. This random texture greatly assists in the coupling of light energy into the solar cell and hence improves efficiency.

For wafers that are not (100) oriented single crystal, texture can also be created by a number of alternative methods, including acid etching, plasma etching, and mechanical abrasion. Following the texturing, the wafers are cleaned using a standard pre-diffusion wet cleansing sequence.

Figure 8:
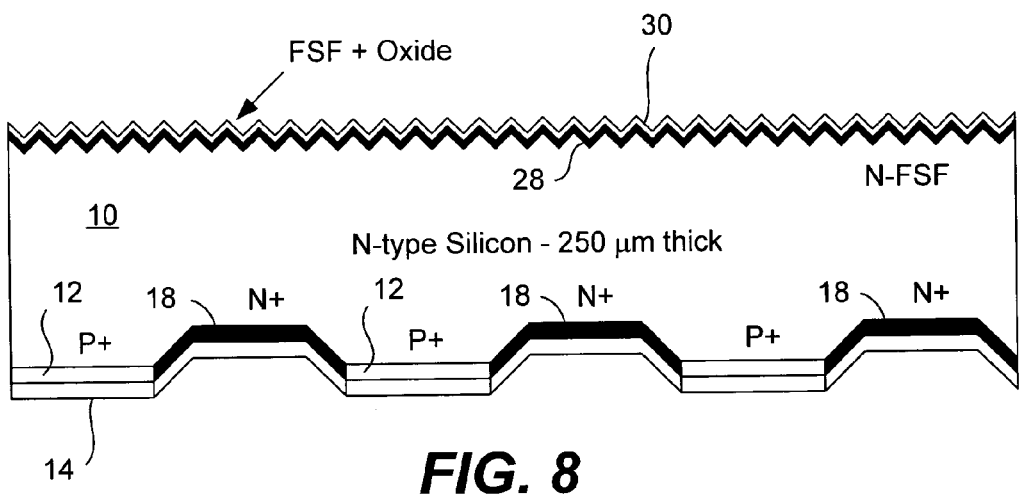

Next, as shown in FIG. 8, the wafers are diffused and oxidized on both sides in a high temperature diffusion furnace, creating doped layer 28 and thermally grown oxide layer 30 on the textured surface. In the preferred embodiment, a liquid phosphorous dopant source ($POCl_3$) is used. The diffusion serves to create a front surface electrical field and good passivation of the silicon-silicon dioxide interface. The combined effect is very low surface recombination velocity, which is essential for high efficiency in the solar cell design.

Further, the wafers can be diffused on the front side on a by back-to-back loading of wafers in the diffusion boats.

Other n+ dopants such as As or Sb can be used. Alternatively, a p-type dopant, such as boron, can be used to create a floating junction, which provides good passivation of the silicon-silicon dioxide interface. In the preferred embodiment, the junction depth is approximately 0.38 µm and the resultant sheet resistivity is approximately 100 ohms/square. The thickness of the thermal oxide layer 30 is approximately 350 Å.

Alternatively, this step can be eliminated, altogether or by using another technique, such as a fixed change in a SiN ARC, to create good surface passivation, or by moving the texture etch before the doping mask and using a single n+ diffusion and oxidation to diffuse both sides of the wafer.

Figure 9:
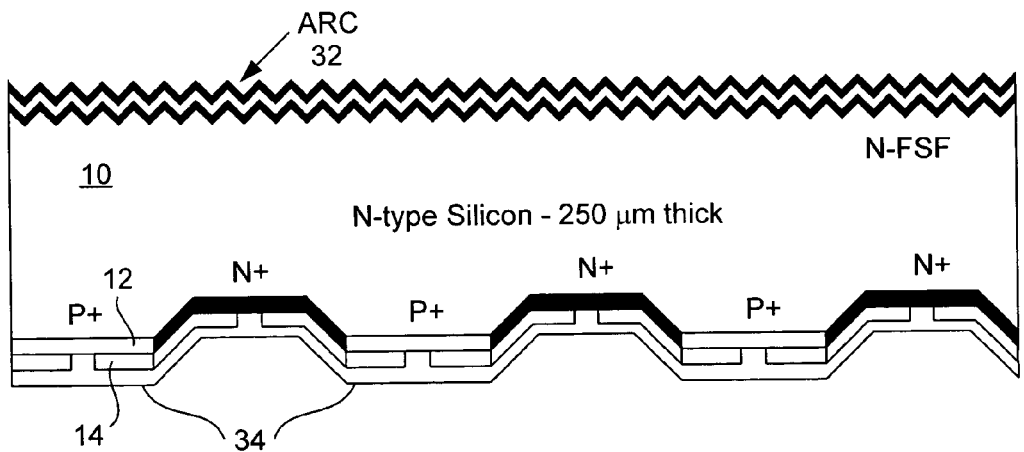

As shown in FIG. 9, an antireflection coating (ARC) 32, such as SiN or $TiO_2$ is then applied to the front surface of the solar cell. This coating assists in the coupling of light energy into the solar cell and hence improves efficiency. Alternatively, the ARC can be deposited after deposition of the seed metal stack described in FIG. 12, infra. Further, the ARC can be applied to both sides of substrate 10.

Figure 10:
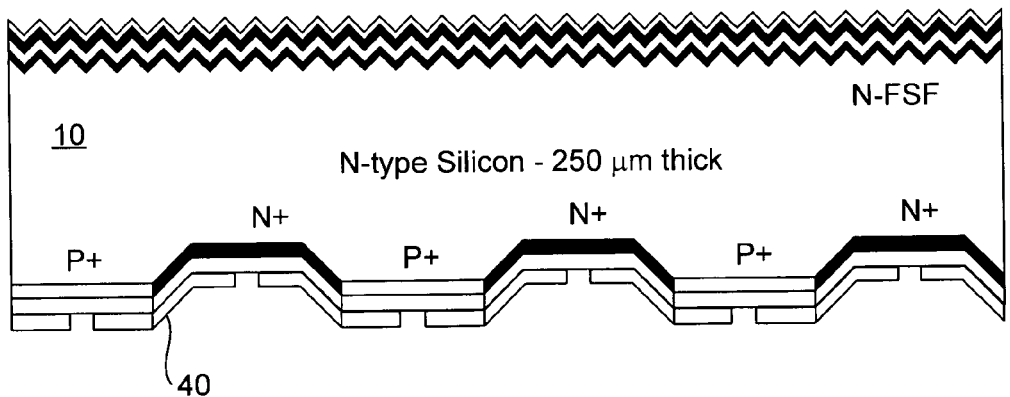
Figure 11:
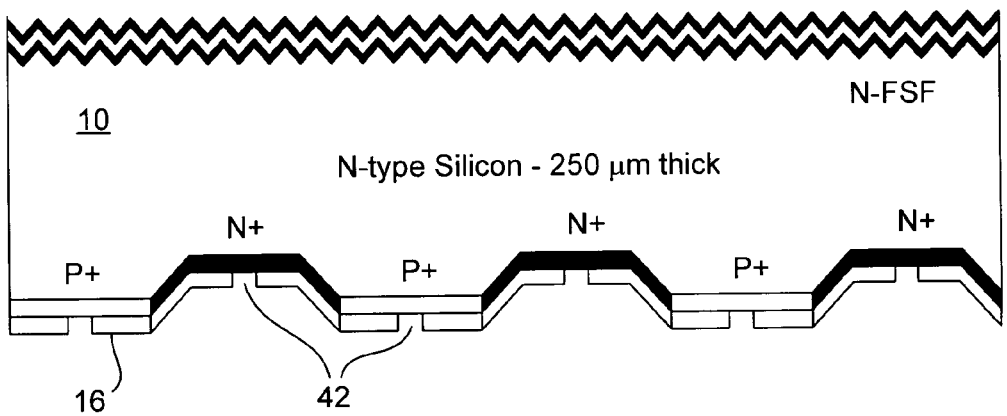

In FIG. 10, the patterned etch resist 40 is applied over the back side thermal oxide by screen printing. Resist 40 is then either thermal or UV cured. Depending on the ARC material, a patterned etch resist may be applied over the front of the solar cell to protect the ARC from subsequent etching. In FIG. 11, arrays of small contact openings 42 are chemically etched in the thermal oxide over both the p and n regions 12, 18, then the etch resist is stripped using a caustic solution. The total contact area as a fraction of the entire back side is typically less than 5%. Reducing the metal to semiconductor contact area greatly reduces photo-generated carrier recombination at the back surface of the solar cell, and hence increases cell efficiency.

Figure 12:
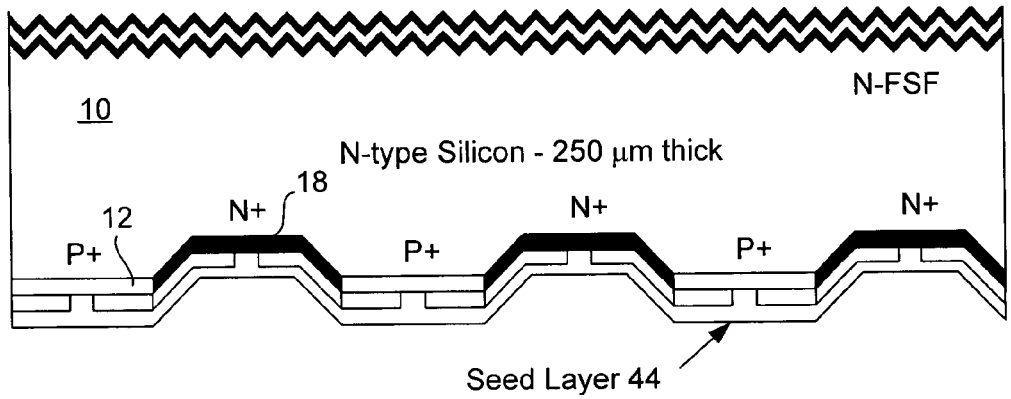

In FIG. 12, a thin (approximately 400 nm) 3-layer seed metal stack 44 is sputtered or evaporated onto the solar cell for contacts to p+ region 12 and n+ region 18. The first layer of the stack, aluminum in the preferred embodiment, makes ohmic contact to the semiconductor material and acts as a back surface reflector. In thin silicon solar cells, weakly absorbed infrared radiation passes through the thickness of silicon and is often lost by absorption in backside metallization. In the preferred embodiment, the seed layer covers mostly silicon oxide, except in small contact openings where it contacts the silicon. The metallized silicon oxide stack is designed to be an excellent infrared reflector, reflecting light back into the cell and effectively multiplying the absorption path length. The front surface texture in combination with the back surface reflector can increase the optical path length to more than 20 times the wafer thickness. This design feature leads to higher photo-generated current in the solar cell.

A second layer, titanium-10%/tungsten-90% (TiW) in the preferred embodiment acts as a diffusion barrier to metals and other impurities. A third layer, copper (Cu) in the preferred embodiment, is used to provide a base for initiating electroplating of metal. Because the seed layer is not required to have significant current-carrying capacity, it can be made very thin. Hence, the manufacturing cost of depositing the seed layer is low. In the preferred embodiment, the metal layer comprises a Al(Si)/TiW/Cu stack, where the aluminum provides ohmic contact and back surface reflectance, TiW acts as the barrier layer, and Cu acts as the plating base. Alternatively, chromium (Cr) can be used as the barrier layer instead of TiW. The metal semiconductor contact can be annealed in a forming gas atmosphere, preferably at 300° C. Alternatively, the contact anneal step can be eliminated.

Figure 13:
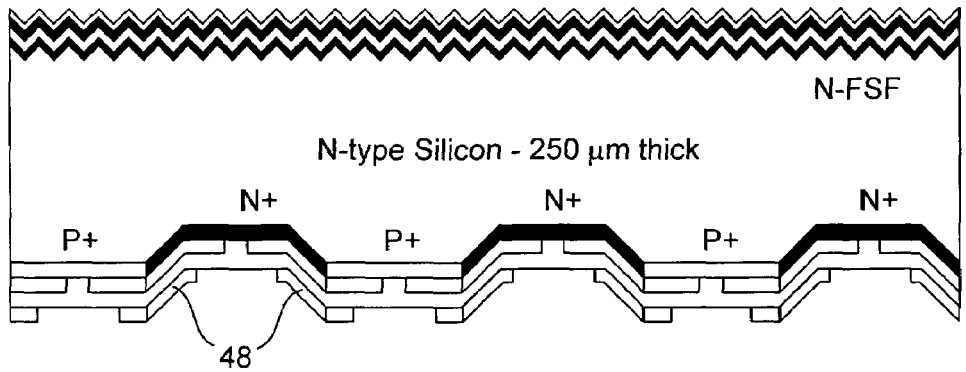

Next, as shown in FIG. 13, a patterned plating resist 48 is applied to the seed layer. In the preferred embodiment, the plating resist is directly patterned on the wafer by screen printing. After application, the plating resist is cured to harden it against the subsequent electroplating solution. Metal does not plate in areas covered by the plating resist.

Figure 14:
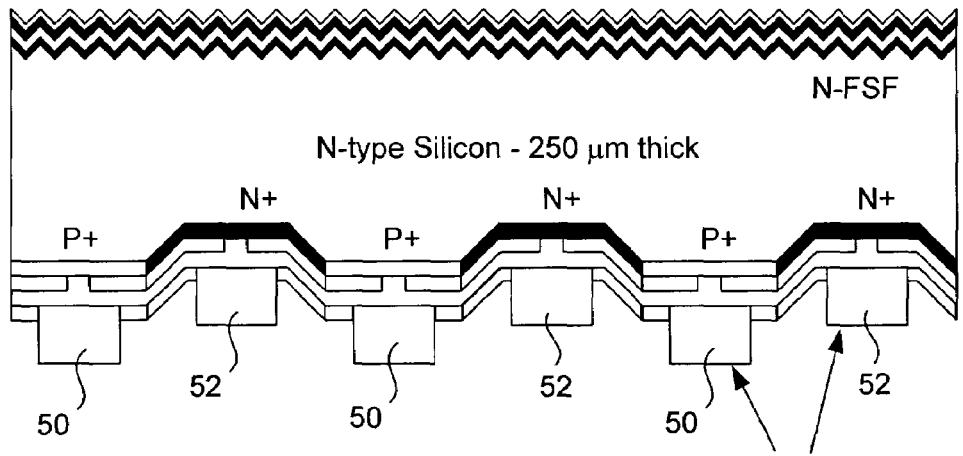

In FIG. 14, the thickness of the metal layer in regions without plating resist is greatly increased by electroplating or electroless plating a good electrical conductor to act as low series resistance metal grid lines 50, 52. In the preferred embodiment, about 20 μm of copper are electroplated. A thin capping layer, such as tin or silver, may be plated after the copper to improve solderability and/or to prevent etching of plated areas during etch back. Preferably about 7 μm of tin are electroplated.

Figure 15:
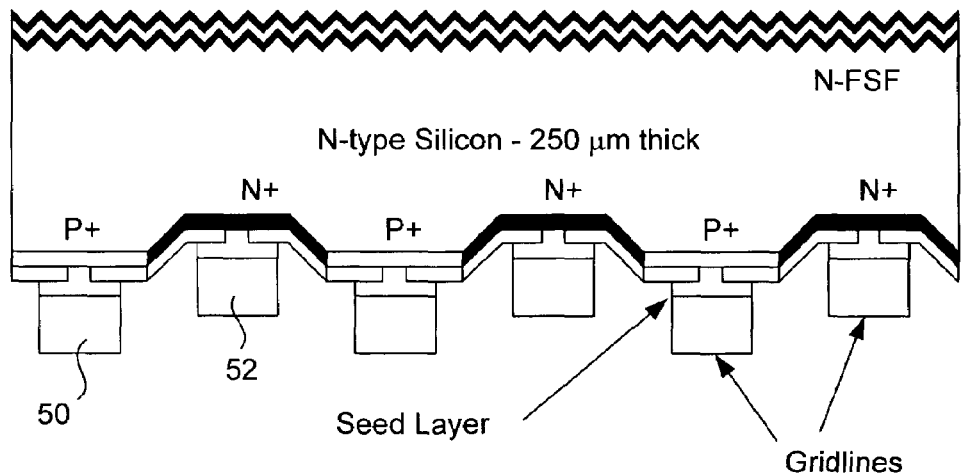

Finally, as shown in FIG. 15, plating resist 48 is stripped and the thin seed metal 44 between the metal grid lines is removed by chemical etching. The etch back chemistries are chosen such that they selectively etch the seed metal stack components over the plated metal capping layer. Alternatively, a small amount of metal on the plated conductive lines may be sacrificed during etch back if an etch resistant metal capping layer is not used, or if the seed layer etch chemistries are not selective.

Alternatively, in FIG. 13 a resist pattern can be used to cover the contact areas and then remove all exposed seed layer by etching thereafter the resist is removed, and the thickness of the metal layer in the contact areas is increased by plating as in FIG. 14.

Figure 16:
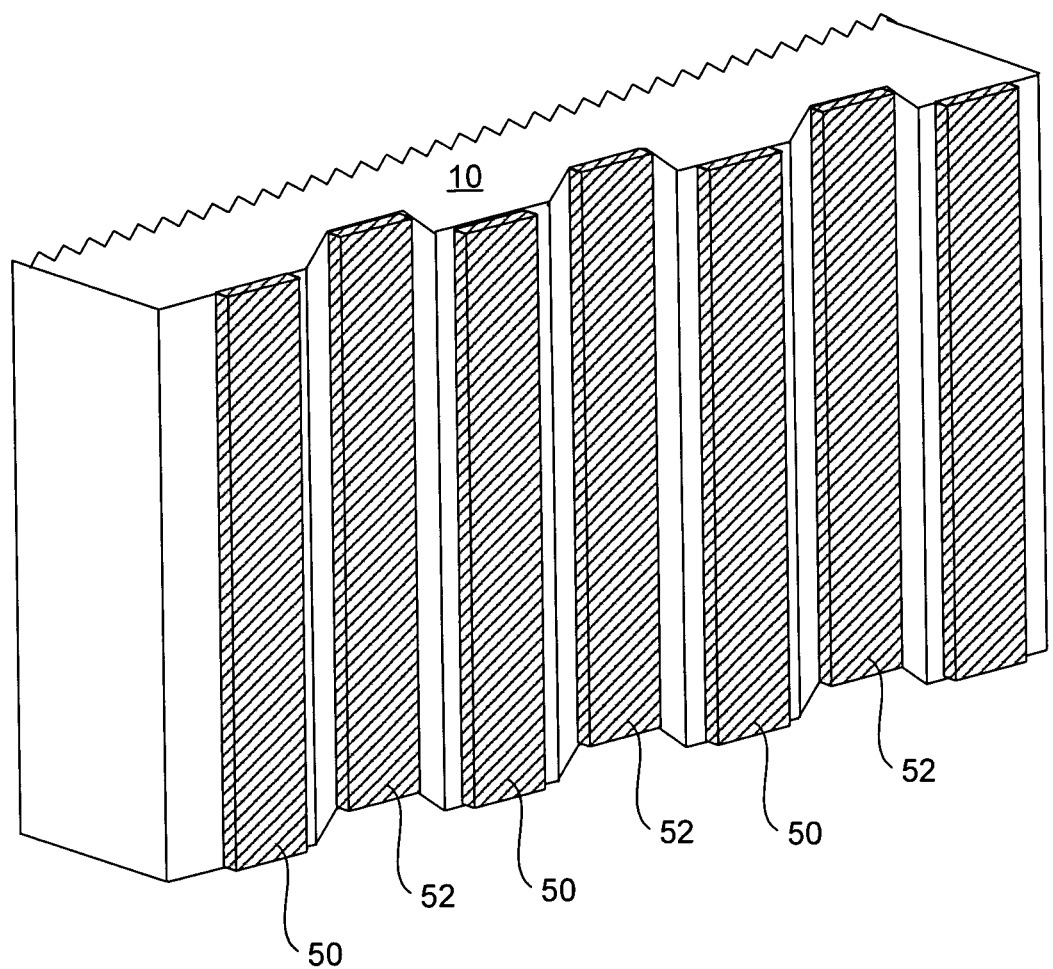
FIG. 16 is a perspective view illustrating the back side of a finished solar cell fabricated in accordance with the invention.

The final structure is shown in perspective view in FIG. 16 showing the interdigitated metal contacts 50, 52 to the p+ regions and n+ regions, respectively, of the solar cell.

A solar cell fabricated in accordance with the invention is economical to manufacture through use of printing technology. The stacked metal contacts provide good ohmic connection and reflection properties on the back side of the cell, and the textured surface on the front side provides greater capture of photons and increased operating efficiency for the cell. A number of alternative processing steps and structural elements have been suggested for the preferred embodiment. Thus while the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A solar cell comprising:
    a) a silicon substrate having a front surface and a back surface,
    b) a plurality of first doped regions of first conductivity type in the back surface and a plurality of second doped regions of second conductivity type in the back surface, and
    c) a first plurality of metal contacts ohmically contacting the first doped regions at a first plurality of contact points and a second plurality of metal contacts ohmically contacting the second doped layers at a second plurality of contact points, wherein the first and second pluralities of metal contacts each comprise a thin seed layer contacting the silicon substrate and an electrically conductive layer over the seed layer which is thicker than the seed layer and wherein the seed layer comprises three layers including,
        a first layer that contacts the silicon and serves as an infrared reflector, the first layer comprising aluminum,
        a barrier layer that covers the first layer, and
        a layer that covers the barrier layer that serves to initiate plating.

2. The solar cell as defined by claim 1, wherein the front surface is textured to facilitate the capture of impinging photons.

3. The solar cell as defined by claim 2, and further including an antireflection coating over the textured front surface.

4. The solar cell as defined by claim 3, wherein the antireflection coating comprises a nitride.

5. The solar cell as defined by claim 4, wherein the antireflection coating comprises silicon nitride.

6. The solar cell as defined by claim 3, wherein the antireflection coating comprises titanium oxide.

7. The solar cell as defined by claim 3, wherein the substrate comprises monocrystalline silicon.

8. The solar cell as defined by claim 7, wherein the monocrystalline silicon has a (100) lattice structure on the front surface.

9. The solar cell as defined by claim 3, wherein the substrate comprises polycrystalline silicon with a minority carrier lifetime greater than 200 microseconds.

10. The solar cell as defined by claim 3, wherein the substrate is doped n-type with a resistivity range of 1-20 ohm-cm.

11. The solar cell as defined by claim 1 wherein the plurality of first doped regions are in first offset layers and the plurality of second doped regions are in second offset layers on the back surface.

12. A solar cell comprising:
    a) a silicon substrate having a front surface and a back surface,
    b) a plurality of first doped regions of first conductivity type in the back surface and a plurality of second doped regions of second conductivity type in the back surface, and
    c) a first plurality of metal contacts ohmically contacting the first doped regions at a first plurality of contact points and a second plurality of metal contacts ohmically contacting the second doped layers at a second plurality of contact points, wherein the first and second pluralities of metal contacts each comprise a thin seed layer contacting the silicon substrate and an electrically conductive layer over the seed layer which is thicker than the seed layer and wherein the seed layer is a 2-layer stack comprising:
        a first layer that contacts the silicon serves as an infrared reflector, the first layer comprising aluminum, and
        a barrier layer that covers the first layer and also serves to initiate plating.

13. A solar cell comprising:
a) a silicon substrate having a front surface and a back surface,
b) a plurality of first doped regions of first conductivity type in the back surface and a plurality of second doped regions of second conductivity type in the back surface,
c) a thermal oxide layer formed on back portions of the first doped regions and on back portions of the second doped regions, the oxide layer having a plurality of contact openings that expose selected back portions of the first and second doped regions defining a plurality of contact points, and
d) a first plurality of metal contacts ohmically contacting the first doped regions through said contact openings at a first plurality of contact points and a second plurality of metal contacts ohmically contacting the second doped layers through said contact openings at a second plurality of contact points,
e) the first and second pluralities of metal contacts each comprising a three layer contact surface that includes,
an aluminum layer that contacts the oxide layer and contacts the exposed back portions of the first and second doped regions, wherein the interface of the aluminum layer and the oxide layer serves as an infrared reflector,
a copper diffusion barrier layer that covers the aluminum layer, and
a copper plating initiation layer that covers the barrier layer.

14. The solar cell of claim 13 wherein a bulk copper layer is formed over the plating initiation layer to provide a set of interdigitated copper contacts.

15. The solar cell as defined by claim 13, wherein the front surface is textured such that the interaction between the textured front surface and the back infrared reflective interface operate to increase the optical path length for infrared photons incident on the cell.

16. The solar cell as defined by claim 15, and further including an antireflection coating over the textured front surface.

\* \* \* \* \*